(12) United States Patent
Furukawa et al.

(10) Patent No.: US 7,271,079 B2
(45) Date of Patent: Sep. 18, 2007

(54) METHOD OF DOPING A GATE ELECTRODE OF A FIELD EFFECT TRANSISTOR

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/907,569

(22) Filed: Apr. 6, 2005

(65) Prior Publication Data

US 2006/0228835 A1    Oct. 12, 2006

(51) Int. Cl.
*H01L 21/425* (2006.01)

(52) U.S. Cl. .............. 438/514; 438/527; 977/742; 977/847; 257/E21.043; 257/E21.743

(58) Field of Classification Search .............. 438/514, 438/527, 532, 303–305; 257/E21.043, E21.473; 977/743–752, 842, 847
See application file for complete search history.

(56) References Cited

U.S. PATENT DOCUMENTS

| | | | |
|---|---|---|---|
| 4,874,946 A | * | 10/1989 | Kazmerski .................. 250/309 |
| 6,232,706 B1 | | 5/2001 | Dai et al. |
| 6,326,279 B1 | * | 12/2001 | Kakizaki et al. ............. 438/406 |
| 6,515,325 B1 | | 2/2003 | Farnworth et al. |
| 6,756,026 B2 | | 6/2004 | Colbert et al. |
| 6,759,305 B2 | | 7/2004 | Lee et al. |
| 2002/0025374 A1 | * | 2/2002 | Lee et al. .................... 427/230 |
| 2002/0167374 A1 | * | 11/2002 | Hunt et al. .................. 333/186 |

(Continued)

OTHER PUBLICATIONS

Yun et al. "Fabrication of Metal Nanowire Using Carbon Nanotube As a Mask." J. Vac. Sci. Technol. A. 18.4 (2000): 1329-1332.*

(Continued)

*Primary Examiner*—B. William Baumeister
*Assistant Examiner*—Matthew W. Such
(74) *Attorney, Agent, or Firm*—Schmeise, Olson & Watts; William D. Sabo

(57) ABSTRACT

A method of fabricating a structure and fabricating related semiconductor transistors and novel semiconductor transistor structures. The method of fabricating the structure includes: providing a substrate having a top surface; forming an island on the top surface of the substrate, a top surface of the island parallel to the top surface of the substrate, a sidewall of the island extending between the top surface of the island and the top surface of the substrate; forming a plurality of carbon nanotubes on the sidewall of the island; and performing an ion implantation, the ion implantation penetrating into the island and blocked from penetrating into the substrate in regions of the substrate masked by the island and the carbon nanotubes.

30 Claims, 8 Drawing Sheets

U.S. PATENT DOCUMENTS

| | | |
|---|---|---|
| 2003/0012722 A1 | 1/2003 | Liu |
| 2003/0165418 A1* | 9/2003 | Ajayan et al. ............ 423/447.2 |
| 2003/0178617 A1 | 9/2003 | Appenzeller et al. |
| 2004/0058153 A1 | 3/2004 | Ren et al. |
| 2004/0121501 A1 | 6/2004 | Large et al. |
| 2005/0095765 A1* | 5/2005 | Saiki et al. ................. 438/197 |

OTHER PUBLICATIONS

Krasheninnikov et al. "Carbon Nanotubes As Masks Against Ion Irradiation: An Insight From Atomistic Simulations." Appl. Phys. Lett. 81 (2002): 1101-1103.*

Pomoell et al. "Stopping of Energetic Ions in Carbon Nanotubes." Nucl. Instr. and Meth. in Phys. Res. B. 206 (2003): 18-21.*

Kotakoski et al. "Irradiation-Assisted Substitution of Carbon Atoms With Nitrogen and Boron in Single-Walled Carbon Nanotubes." Nucl. Instr. and Meth. in Phys. Res. B. 228 (2005): 31-36.*

Yun et al. "Fabrication of Metal Nanowire Using Carbon Nanotube As a Mask." J. Vac. Sci. Technol. A. 18.4 (2000): 1329-1332.*

Krasheninnikov et al. "Carbon Nanotubes As Masks Against Ion Irradiation: An Insight From Atomistic Simulations." Appl. Phys. Lett. 81 (2002): 1101-1103.*

Pomoell et al. "Stopping of Energetic Ions in Carbon Nanotubes." Nucl. Instr. and Meth. in Phys. Res. B. 206 (2003): 18-21.*

Kotakoski et al. "Irradiation-Assisted Substitution of Carbon Atoms With Nitrogen and Boron in Single-Walled Carbon Nanotubes." Nucl. Instr. and Meth. in Phys. Res. B. 228 (2005): 31-36.*

* cited by examiner

METHOD OF DOPING A GATE ELECTRODE OF A FIELD EFFECT TRANSISTOR

FIELD OF THE INVENTION

The present invention relates to the field of semiconductor device fabrication; more specifically, it relates to method of doping a gate electrode of a field effect transistor.

BACKGROUND OF THE INVENTION

In advanced field effect transistor (FET) designs, to improve FET performance it has been proposed to decrease the thickness of the gate electrode depletion layer formed when the FET is turned on. That is, as the physical dimensions of the FET decrease and electric field intensity in the channel region increase, the thickness of the depletion layer formed within the polysilicon gate electrode increases. This thickened depletion layer reduces the effectiveness of the gate electrode potential in controlling channel conduction, and thus degrades device performance. Conventional doping processes have been employed to dope the polysilicon electrode simultaneously with the FET source/drains. With this method, however, electrode carrier depletion effects are overly influenced by the required doping concentration of the source/drains near the gate dielectric of the FET being fabricated, and the required source/drain doping levels are not the best levels for achieving thin depletion layers in the electrode. Another method has been to pre-dope the polysilicon layer before etching the polysilicon layer into gate electrodes, thus decoupling the gate doping process from the source/drain doping process. However, it has been found that the resultant gate electrodes have severe image size control and reliability problems due to the presence of electrode material having widely differing dopant concentrations. Therefore, there is a need for a method of fabricating an FET with reduced gate electrode depletion layer thickness when the device is turned on.

SUMMARY OF THE INVENTION

A first aspect of the present invention is a method of fabricating a structure, comprising: providing a substrate having a top surface; forming an island on the top surface of the substrate, a top surface of the island parallel to the top surface of the substrate, a sidewall of the island extending between the top surface of the island and the top surface of the substrate; forming a plurality of carbon nanotubes on the sidewall of the island; and performing an ion implantation, the ion implantation penetrating into the island and blocked from penetrating into the substrate in regions of the substrate masked by the island and the carbon nanotubes.

A second aspect of the present invention is a method of fabricating a semiconductor transistor, (a) providing a substrate; (b) forming a gate dielectric layer on a top surface of the substrate; (c) forming a polysilicon gate electrode on a top surface of the gate dielectric layer; (d) forming spacers on opposite sidewalls of the polysilicon gate electrode; (e) forming source/drain regions in the substrate on opposite sides of the polysilicon gate electrode and simultaneously forming a first doped region in the polysilicon gate electrode, the first doped region extending into the polysilicon gate electrode from a top surface of the polysilicon gate electrode; (f) forming a plurality of carbon nanotubes on sidewalls of the spacers; (g) forming, by ion implantation, a buried second doped region in the polysilicon gate electrode, the buried second doped region extending no deeper into the polysilicon gate electrode than to the polysilicon gate electrode than to the gate dielectric layer and not penetrating into the gate dielectric layer or into the substrate in regions of the substrate masked by the polysilicon gate electrode, the spacers and the carbon nanotubes; and (h) removing the carbon nanotubes.

A third aspect of the present invention is a method of fabricating a semiconductor transistor, (a) providing a substrate; (b) forming a gate dielectric layer on a top surface of the substrate; (c) forming a polysilicon gate electrode on a top surface of the gate dielectric layer; (d) forming first spacers on opposite sidewalls of the polysilicon gate electrode; (e) forming source/drain regions in the substrate on opposite sides of the polysilicon gate electrode and simultaneously forming a first doped region in the polysilicon gate electrode, the first doped region extending into the polysilicon gate electrode from a top surface of the polysilicon gate electrode; (f) forming second spacers on outer surfaces of the first spacers; (g) forming a plurality of carbon nanotubes on sidewalls of the second spacers; (h) forming, by ion implantation, a buried second doped region in the polysilicon gate electrode, the buried second doped region extending no deeper into the polysilicon gate electrode than to the gate dielectric layer and not penetrating into the gate dielectric layer or into the substrate in regions of the substrate masked by the polysilicon gate electrode, the spacers and the carbon nanotubes; and (i) removing the carbon nanotubes.

A fourth aspect of the present invention is a semiconductor transistor, comprising: a well region in a substrate; a gate dielectric layer on a top surface of the well region; a polysilicon gate electrode on a top surface of the gate dielectric layer; spacers formed on opposite sidewalls of the polysilicon gate electrode; source/drain regions formed on opposite sides of the polysilicon gate electrode in the well region; a first doped region in the polysilicon gate electrode, the first doped region extending into the polysilicon gate electrode from a top surface of the polysilicon gate electrode; and a buried second doped region in the polysilicon gate electrode.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
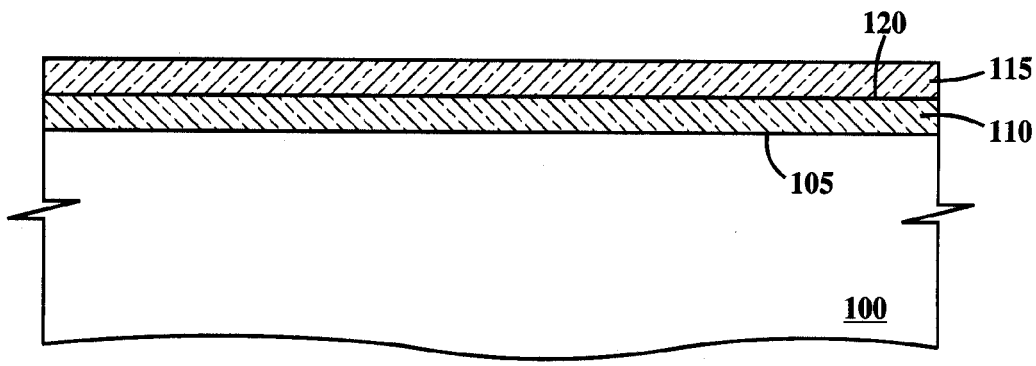
FIGS. 1A through 1E are cross-sectional drawings illustrating preliminary steps in fabrication of a field effect transistor according to the present invention.

FIGS. 1A through 1E are cross-sectional drawings illustrating preliminary steps in fabrication of a field effect transistor according to the present invention. In FIG. 1A, a substrate 100 having a top surface 105 is provided. A first pad layer 110 is formed on top surface 105 of substrate 100 and a second pad layer 115 is formed on a top surface 120 of first pad layer 110. In one example substrate 100 is a bulk, single crystal silicon substrate. In a second example, substrate 100 is a silicon-on-insulator (SOI) substrate. An example of an SOI substrate is a substrate having a single crystal silicon layer on a silicon dioxide (layer) on a substrate (often a silicon substrate). In one example, first pad layer 110 is silicon dioxide and second pad layer 115 is silicon nitride. First and second pad layers 110 and 115 are used to protect surface 105 of substrate 100 during subsequent fabrication steps and to act as a hard mask for the process described infra in reference to FIG. 1B.

Figure 1B:
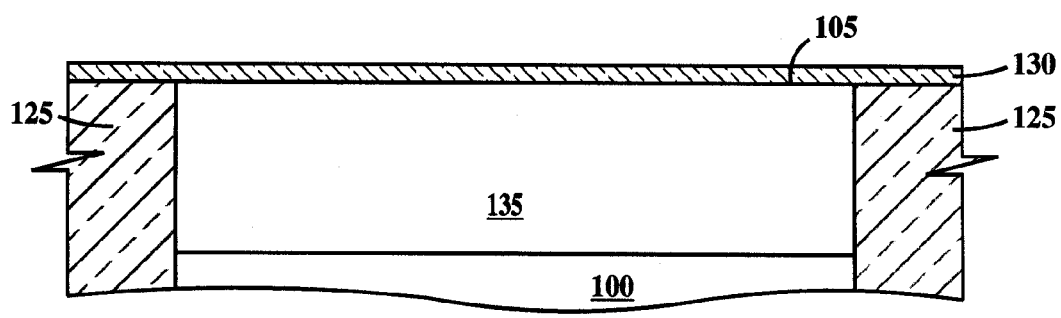

In FIG. 1B, trench isolation (TI) 125 is formed in substrate 100. TI 125 may be formed using a pattern formed in first and second pad layers 110 and 115 (see FIG. 1A) as an etch mask. TI 125 may be a deep trench (DT) isolation or a shallow trench isolation (STI). The etch mask is used to form trenches in the substrate (for example by reactive ion etching (RIE)). Etching is followed by a blanket deposition of an insulator (for example chemical vapor deposition (CVD) of tetraethoxysilane (TEOS) oxide) to fill the trenches. Deposition of the insulator is followed by a chemical-mechanical polish to remove excess insulator. First and second pad layers 110 and 115 (see FIG. 1A) are then removed (if still present after CMP) and a gate dielectric layer 130 formed on top surface 105 of substrate 100. In a first example, gate dielectric layer 130 comprises thermally grown or deposited silicon dioxide which is nitridized by plasma or thermal nitridation and having a thickness of about 1 nm or more. In a second example dielectric layer 130 is a high-K (dielectric constant from about 7 to about 30) material, examples of which include but are not limited to silicon nitride, metal silicates such as $HfSi_xO_y$ and $HfSi_xO_yN_z$, metal oxides such as $Al_2O_3$, $HfO_2$, $ZrO_2$, $TaO_5$, and $BaTiO_3$, and combinations of layers thereof.

Also in FIG. 1B, a well 135 is formed in substrate 100. For an N-channel FET (NFET), well 135 is doped P-type, for example, by an ion implantation of a boron-containing species. For a P-channel FET (PFET), well 135 is doped N-type, for example, by an ion implantation of an arsenic or phosphorus-containing species.

Figure 1C:
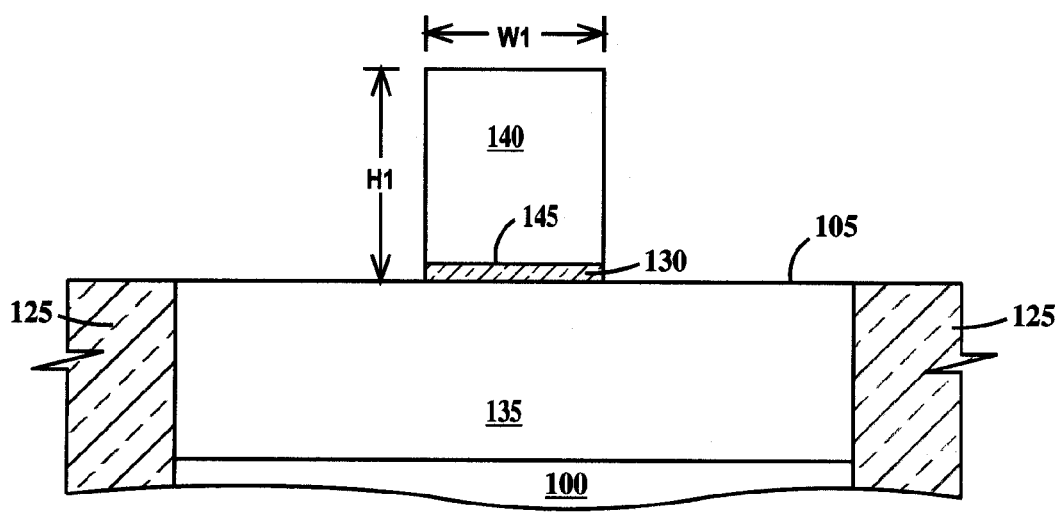

In FIG. 1C, a gate electrode 140 is formed on a top surface 145 of gate dielectric layer 130. Gate electrode 140 may be formed by deposition of a polysilicon layer, followed by photolithography to define the gate shape and then an RIE process to remove excess polysilicon. Gate electrode 140 may be intrinsic (undoped) polysilicon or lightly-doped (not greater than about 1E15 atoms/cm³ to about 1E16 atoms/cm³) P or N type. Lower doping levels will adversely effect (i.e. increase) the thickness of the depletion layer of the completed gate electrode. Gate electrode 140 has a height H1 and a width W1. In one example, H1 is between about 100 nm to about 150 nm. In one example, W1 is between about 50 nm and about 500 nm. In FIG. 1C, gate dielectric layer 130 is illustrated as extending only under gate electrode 140, having been removed from other regions of top surface 105 of substrate 100 and from over TI 125. However, depending upon the exact material and thickness of gate dielectric layer 130 and the types of processes to which the gate dielectric layer is exposed, it is possible for all of or a fractional thickness of gate dielectric layer 130 to still exist on top surface 105 of substrate 100 and over TI 125.

Figure 1D:
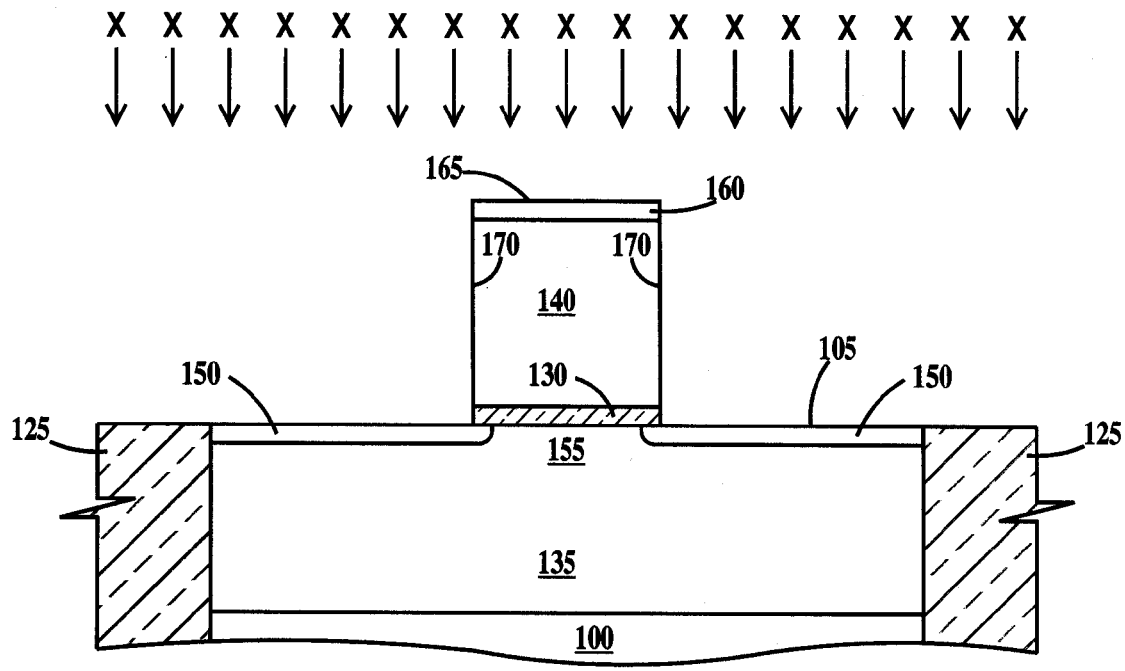

In FIG. 1D, a source/drain extension ion implantation of species X is performed using gate electrode 140 as an ion implantation mask to form source/drain extensions 150 in well 135 in substrate 100, thus defining a channel region 155 between source/drain extensions 150 and under the gate electrode. Source/drain extensions 150 extend from top surface 105 of substrate 100 into the substrate. A first doped region 160 of gate electrode 140 extending from a top surface 165 of the gate electrode into the gate electrode is also formed during the extension ion implantation. An inversion layer will be formed in channel region 155, connecting source/drain extensions 150, when the FET is turned on. For an NFET, species X comprises, for example, arsenic and/or phosphorus. For a PFET, species X comprises, for example, boron.

Alternatively, a spacer may be formed on sidewalls 170 of gate electrode 140 prior to performing the source/drain extension ion implantation. Spacer formation is described infra.

Figure 1E:
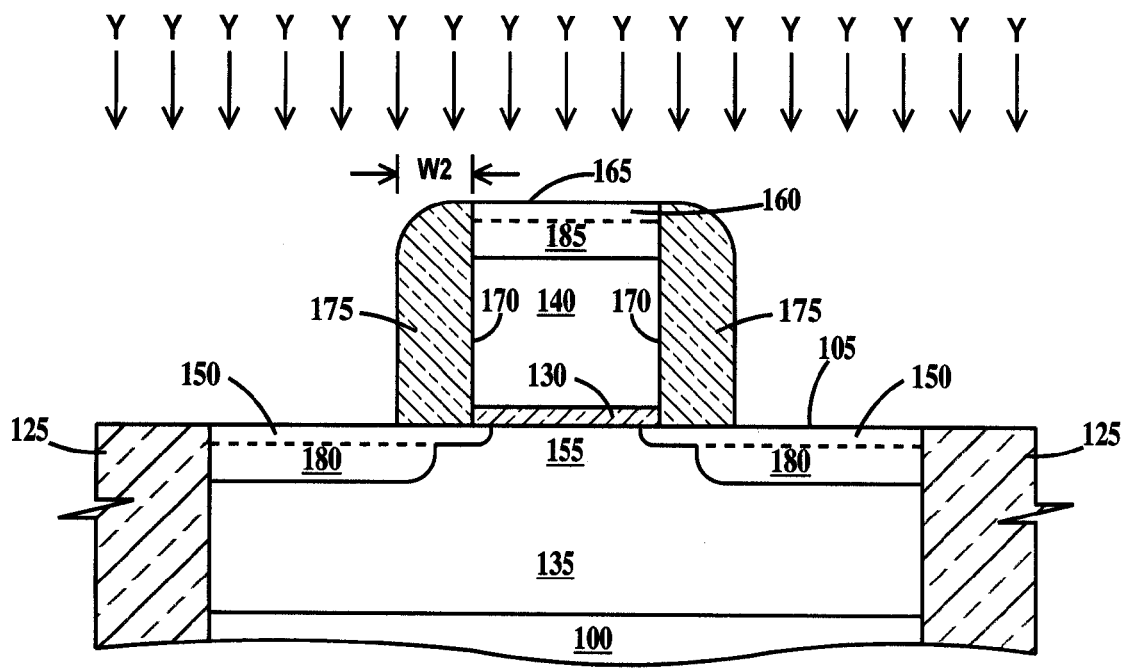

In FIG. 1E, spacers 175 having a width W2 are formed on sidewalls 170 of gate electrode 140. Spacers are formed by depositing a conformal layer and then performing an RIE to remove the conformal layer from all surface perpendicular to the direction of travel of the ions of the RIE process, leaving the conformal layer on surfaces parallel to the direction of travel of the ions, i.e. on the sidewalls 170. In one example, spacers 175 are silicon nitride or silicon dioxide. In one example, W2 is between about 20 nm to about 100 nm. After spacer formation, a source/drain implantation of species Y is performed using gate electrode 140 and spacers 175 as an ion implantation mask to form source/drains 180 in well 135 in substrate 100. Source/drains 180 extend from top surface 105 of substrate 100 through source/drain extensions 150 into the substrate. A second doped region 185 of gate electrode 140 extending from top surface 165 through first doped region 165 of the gate electrode into the gate electrode is also formed during the source/drain ion implantation. For an NFET, species Y comprises, for example, arsenic and/or phosphorus. For a PFET, species Y comprises, for example, boron.

Figure 2A:
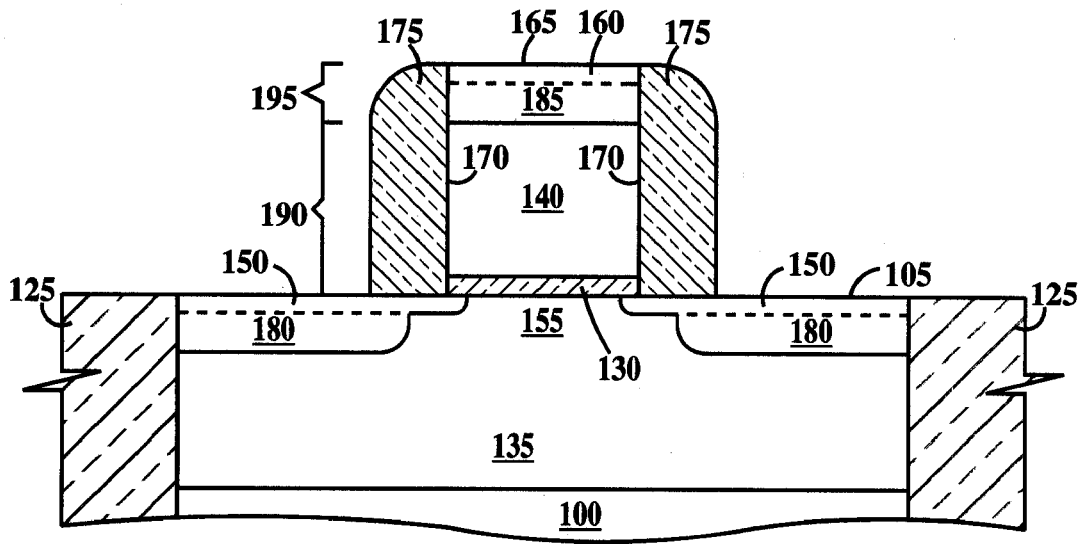
FIGS. 2A through 2E are cross-sectional drawings illustrating fabrication of a gate electrode of a field effect transistor according to a first embodiment of the present invention.

FIGS. 2A through 2E are cross-sectional drawings illustrating fabrication of a gate electrode of a field effect transistor according to a first embodiment of the present invention. FIG. 2A is identical to FIG. 1E. However, it should be noted that while spacers 175 are illustrated as having a lower first portion 190 of uniform thickness and an upper, curved portion 195 tapering to zero thickness in the vicinity of top surface 165 of the gate electrode, this particular geometry of spacers 175 is exemplary and other geometries, such as that illustrated in FIG. 2A1 are also suitable spacer geometries for practicing the present invention. In FIG. 2A1, spacers 175A continually change in thickness (relative to sidewalls 170 of gate electrode) from top surface 105 to top surface 165.

Figure 2B:
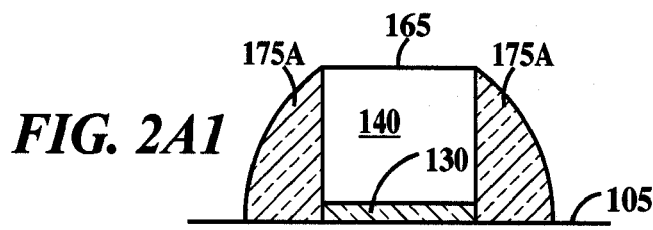
Figure 2B:
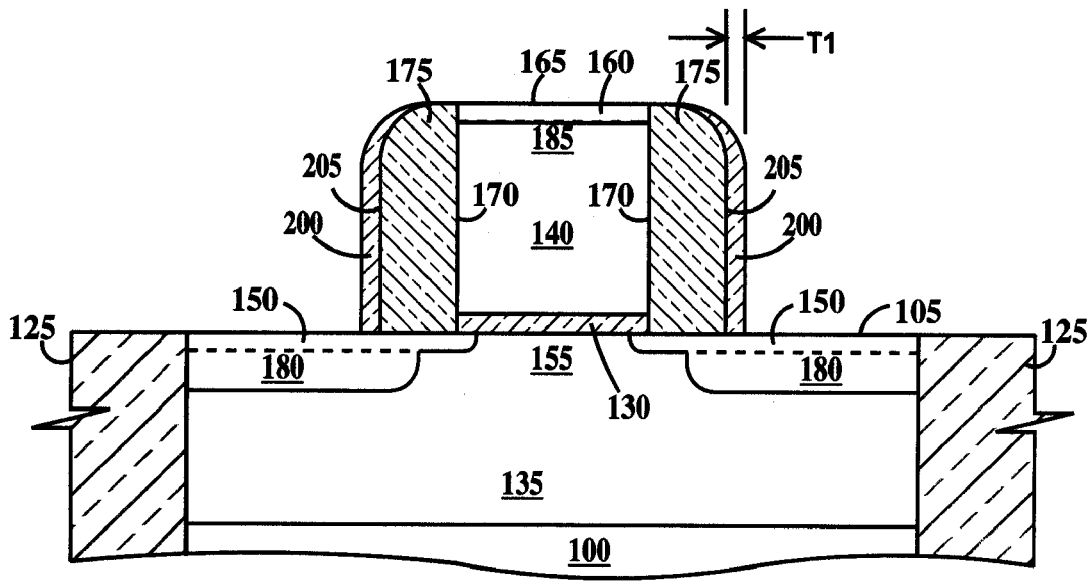

In FIG. 2B, spacers 200 are formed on outer surface 205 of spacers 175. Spacers 200 have a maximum thickness of T1. In one example T1 is between about 1 nm and about 3 nm. Spacers 200 may comprise any number of metal or semiconductor oxides. In a first example, spacers 200 comprise silicon dioxide and are formed by a blanket deposition of silicon dioxide followed by an RIE using a process selective to etch silicon dioxide over silicon. In a second example, spacers 200 comprise aluminum oxide, tantalum oxide, hafnium oxide, or silicon oxynitride. If spacers 175 comprise silicon dioxide as taught supra, then spacers 200 need not be formed.

Figure 2C:
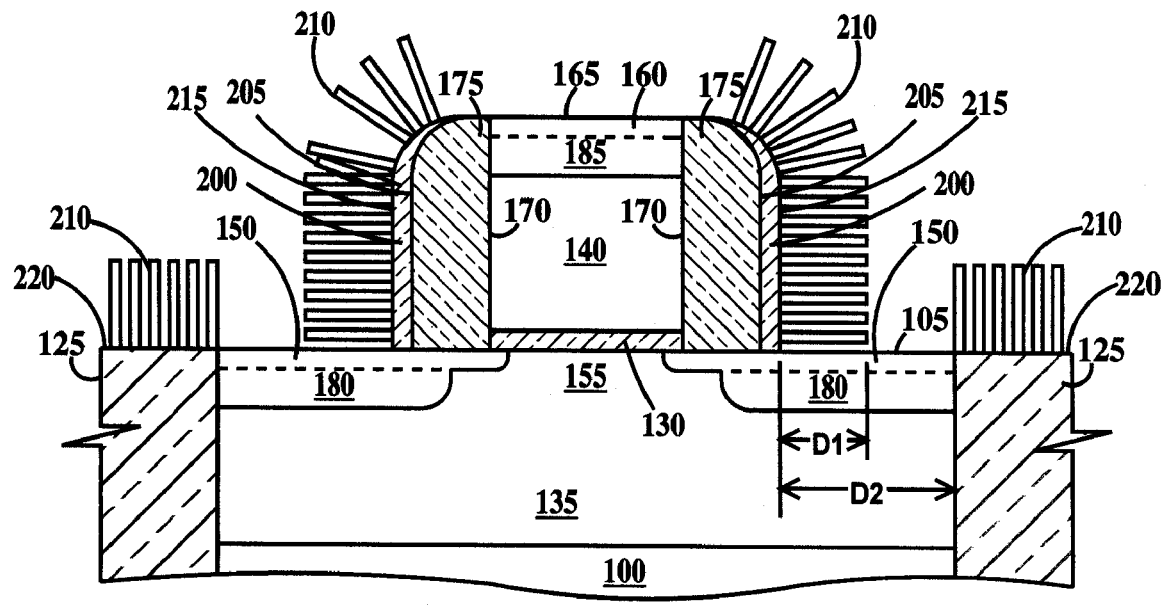

In FIG. 2C, an optional oxide removal process is performed to remove all gate dielectric oxides that may be present on exposed top surface 105 of substrate 100. In the example that gate dielectric layer 130 is silicon dioxide, a dilute HF etchant may be used. Then, carbon nanotubes (CNTs) 210 are formed on outer surfaces 215 of spacers 200 and on exposed top surfaces 220 of TI 125. CNTs 210 grow outward from outer surfaces 215 of spacers 200 and top surface 220 of TI 125. In one example, CNTs 210 grow about perpendicular to outer surfaces 215 of spacers 200. If spacers 175 comprise silicon dioxide and spacers 200 are not formed as taught supra, then CNTs 210 can be formed on outer surfaces 205 of spacers 175.

CNTs are more correctly called carbon fullerenes, which are closed-cage molecules composed of $sp^2$-hybridized carbon atoms arranged in hexagons and pentagons. There are two types of carbon fullerenes, namely closed spheroid cage fullerenes also called "bucky balls" and fullerene tubes. Fullerene tubes come in two types, single-wall fullerenes tubes, which are hollow tube-like structures or and multi-wall fullerene tubes. Multi-wall fullerenes resemble sets of concentric cylinders. The present invention utilizes both single-wall carbon fullerenes, hereinafter called single-wall nanotubes (SWNT), and multi-wall carbon fullerenes, hereafter called multi-wall nanotubes (MWNT). CNTs 210 may be in the form of individual SWNTs, individual MWNTs, bundles of SWNTs, bundles of MWNT, or bundles of CNTs comprising both of SWNTs and MWNTs. CNTs 210 may grow as continuous bundles over each isolated oxide surface.

CNTs 210 are grown by exposing outer surfaces 215 of spacers 200 and top surfaces 220 of TI 125 to a vapor mixture of a CNT precursor and a CNT catalyst at an elevated temperature. In one example, the CNT precursor is a xylene or xylene isomer mixture ($C_8H_{10}$) and the CNT catalyst is ferrocene ($Fe(C_5H_5)_2$) heated to between about 600° C. and about 1100° C. or heated to between about 700° C. and about 900° C.

A more detailed discussion of formation of CNTs according to the first method of forming CNTs may be found in United States Patent Publication US 2003/0165418 to Ajayan et al., filed on Feb. 11, 2003, which is hereby incorporated by reference in its entirety.

CNTs 210 extend a maximum distance D1 (measured along top surface 105 of substrate 100) from spacers 200 over source/drains 180 toward TI 125. TI 125 is spaced a minimum distance D2 from spacers 200 (measured along top surface 105 of substrate 100). In one example D1 is about one half of D2 to about equal to D2. In one example D1 is between about 60 nm and about 300 nm.

Figure 2D:
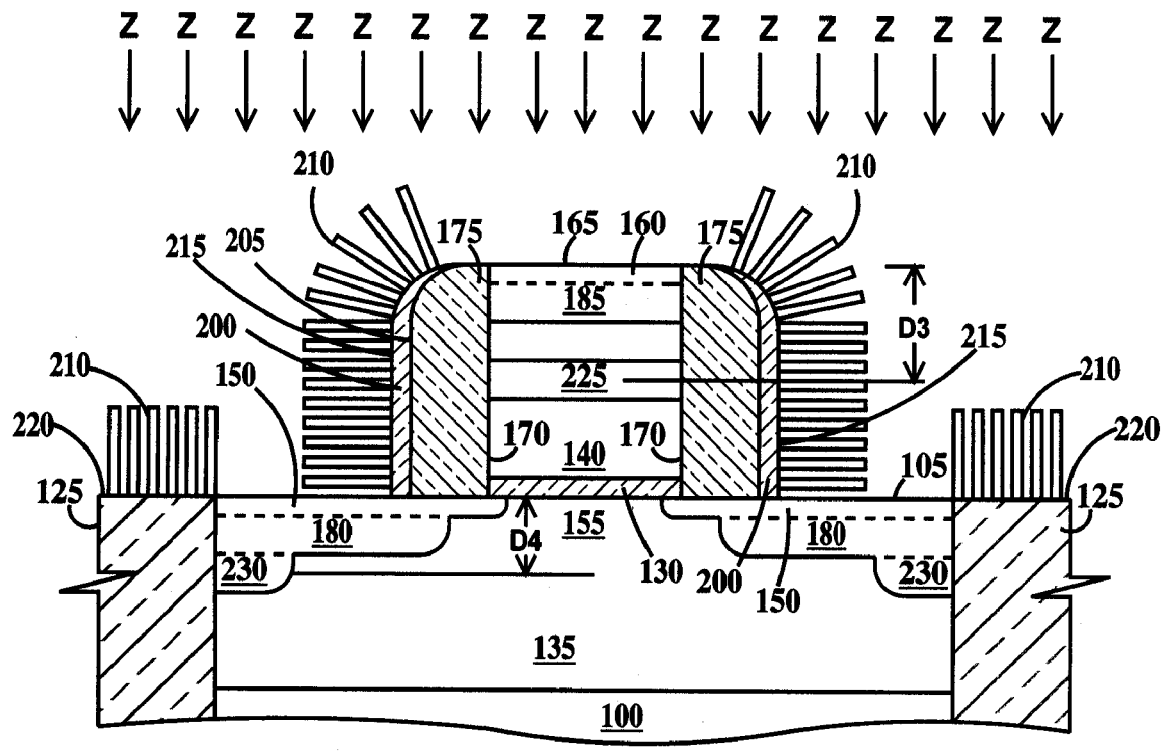

In FIG. 2D, an ion implantation of species Z is performed using gate electrode 140, spacers 175, spacers 200 (if present) and CNTs 210 as an ion implantation mask to form a buried doped region 225 in gate electrode 140. For an NFET, species Z comprises, for example, arsenic and/or phosphorus. For a PFET, species Z comprises, for example, boron. In one example, species Z is implanted with a dose of about 5E14 to about 5E15 atoms/cm². Buried doped regions 230 are also formed in substrate 100 if D2 is greater than D1 (see FIG. 2C). Buried doped region 225 of gate electrode 140 serves as an additional source of dopant atoms for gate electrode 140. After anneal, the additional dopant acts to reduce the thickness of the depletion layer formed in gate conductor 140 near gate dielectric 130 when the transistor is turned on at a given gate voltage to a thickness that would otherwise be obtained without buried doped region 225 being present.

The peak of the dopant distribution of buried doped region 225 is centered a depth D3 from top surface 165 of gate electrode 140 and the peak of the dopant distribution of buried doped regions 230 is centered a depth D4 from top surface 105 of substrate electrode 100. After anneal, the tail of the distribution of buried doped region 225 may touch gate dielectric layer 130 or may be spaced away from the gate dielectric layer as shown in FIG. 2D. The closer buried doped region 225 is to gate dielectric layer 130, the thinner the depletion layer that may be obtained. Buried doped region 225 should not extend into gate dielectric layer 130 or channel region 155. Buried doped regions 230 should not extend under spacers 175 and should be spaced laterally away from source/drain extensions 150. In one example D3 is about equal to D4. In one example, D3 and D4 are each independently between about 30 nm and about 50 nm when H1 (see FIG. 1C) is between about 100 nm and about 150 nm. In one example, D3 is about one third of H1 (see FIG. 1C) or less.

Figure 2E:
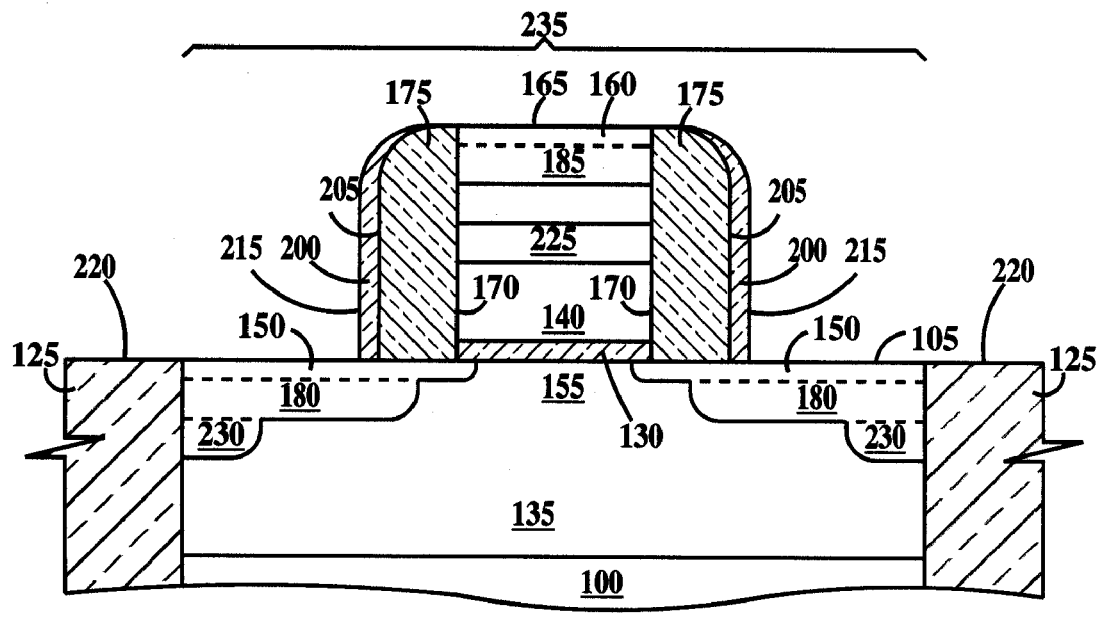

In FIG. 2E, CNTs 210 (see FIG. 2D) are removed using, for example, an oxygen or ozone plasma. Major fabrication steps of an FET 235 (which may be an NFET or a PFET) are thus completed. Additional steps, such as silicidation of exposed top surfaces of source/drain regions 180 and exposed top surface of gate electrode 140, forming contacts to gate electrode 140, source/drains 180, and substrate 100 may be performed.

Figure 2F:
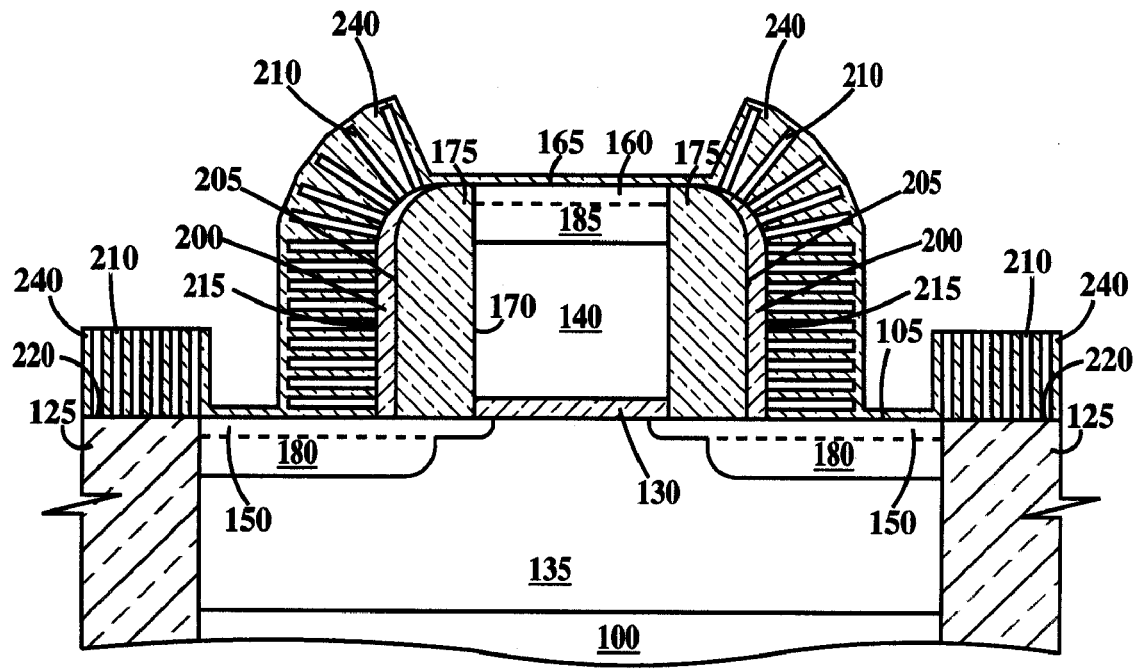
FIG. 2F is a cross-sectional drawing illustrating an optional step in the fabrication of a gate electrode of a field effect transistor according to a first embodiment of the present invention.

FIG. 2F is a cross-sectional drawing illustrating an optional step in the fabrication of a gate electrode of a field effect transistor according to a first embodiment of the present invention. In FIG. 2F, an optional conformal layer 240 is formed over CNTs 210 to stabilize and/or increase the blocking power to implantation of species Z (see FIG. 2D) prior to implantation of species Z described supra. In one example, conformal layer 240 comprises a plasma carbon-fluorine polymer about 5 nm thick formed in situ in a plasma deposition tool having a vertical etch component.

Figure 3A:
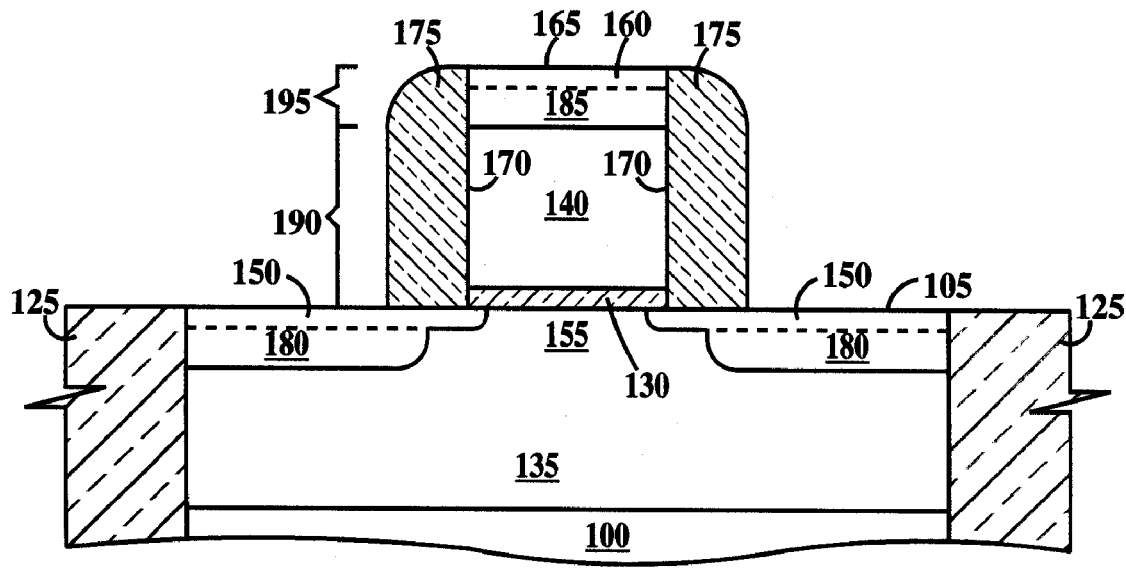
FIGS. 3A through 3E are cross-sectional drawings illustrating fabrication of a gate electrode of a field effect transistor according to a second embodiment of the present invention.

FIGS. 3A through 3E are partial-cross-sectional drawings illustrating fabrication of a gate electrode of a field effect transistor according to a second embodiment of the present invention. FIGS. 3A and 3A1 are identical to FIGS. 2A and 2A1 respectively.

Figure 3B:
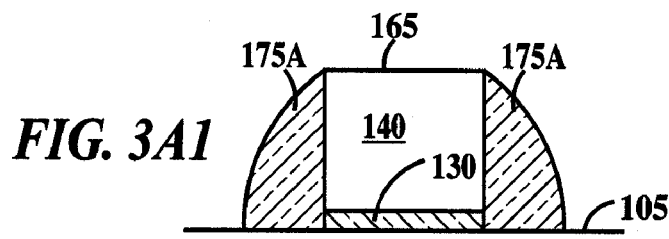
Figure 3B:
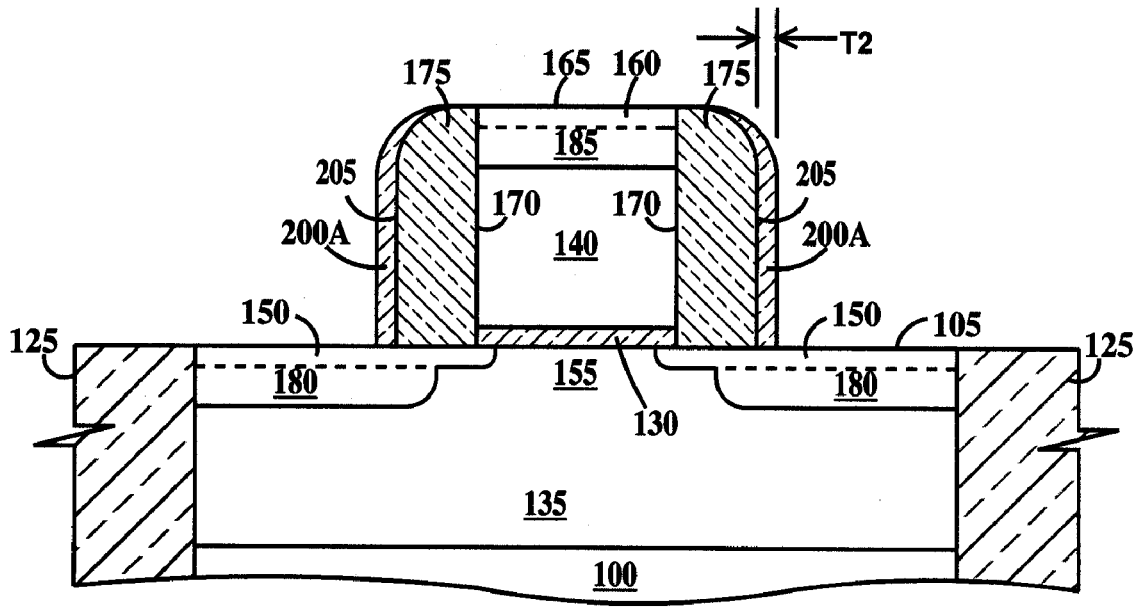

FIGS. 3B through 3F are similar to FIGS. 2B through 2F except for differences that will be explained infra. In FIG. 3B, spacers 200A are formed on outer surface 205 of spacers 175. Spacers 200A have a maximum thickness of T2. In one example T2 is between about 1 nm and about 3 nm. Spacers 200A may comprise any number of metals. In one example, spacers 200A comprise cobalt and are formed by a blanket deposition of a conformal layer of cobalt followed by an RIE using a process selective to etch cobalt over silicon. Spacers 200A may also be similarly formed from conformal layers of nickel or iron. Optionally, a protective layer such as silicon dioxide or silicon nitride of 2 to 5 nm thickness may be formed between the spacer and the substrate surface 150

Figure 3C:
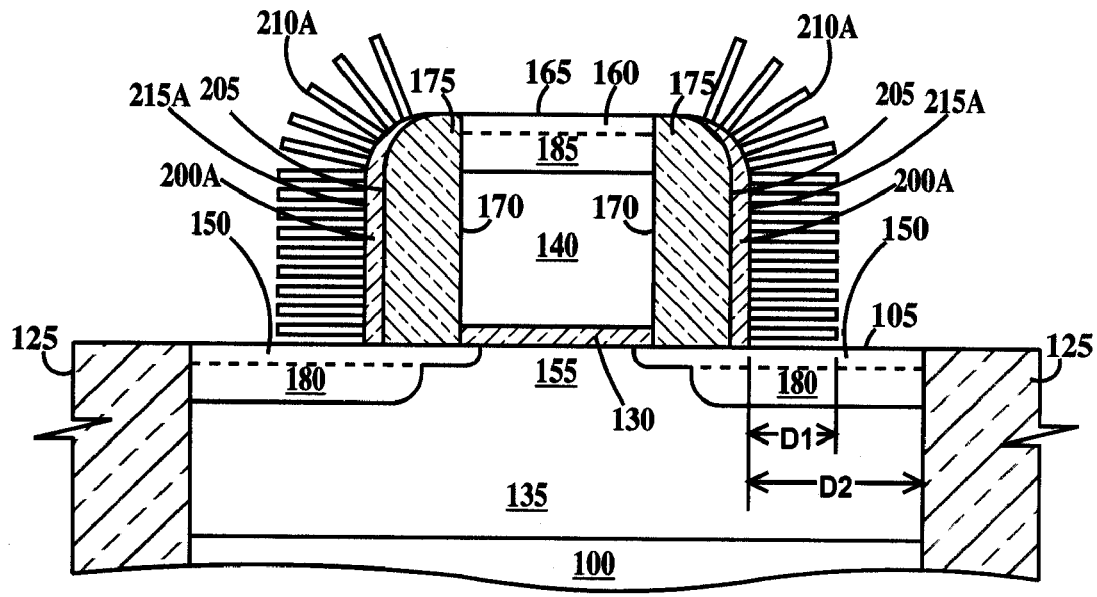

In FIG. 3C, CNTs 210A are formed on, and grow outward from, outer surfaces 215A of spacers 200A. In one example, CNTs 210A grow about perpendicular to outer surfaces 215A of spacers 200A. CNTs 210A may be in the form of individual SWNTs, individual MWNTs, bundles of SWNTs, bundles of MWNT or bundles of CNTs comprising both of SWNTs and MWNTs. CNTs 210A may grow as continuous bundles over each isolated metal surface.

CNTs 210A are grown exposing outer surfaces 215A of spacers 210A to a vapor mixture of a CNT precursor at an elevated temperature, generally a temperature above about 500° C. In a first example, the CNT precursor is a mixture of carbon monoxide and hydrogen heated to between about 800° C. to about 900° C. In a second example, the CNT precursor is methane heated to between about 800° C. to about 900° C. In a third example, the CNT precursor is a mixture of acetylene and ammonia heated to between about 700° C. to about 900° C. In a fourth example, the CNT precursor is a mixture of methane and ammonia heated to between about 500° C. to about 700° C.

A more detailed discussion of formation of CNTs according to the second method of forming CNTs may be found in United States Patent Publication US2004/0058153 to Ren et al., filed on Mar. 25, 2004; United States Patent Publication US2003/0012722 to Liu., filed on Jan. 16, 2003 to; U.S. Pat. No. 6,756,026 to Colbert et al., filed on Jun. 29, 2004; and U.S. Pat. No. 6,232,706 to Dai et al., filed on May 15, 2001 which are hereby incorporated by reference in their entireties.

CNTs 210A extend a maximum distance D1 (measured along top surface 105 of substrate 100) from spacers 200A over source/drains 180 toward TI 125. TI 125 is spaced a minimum distance D2 from spacers 200A (measured along top surface 105 of substrate 100). In one example D1 is about one half of D2 to about equal to D2. In one example D1 is between about 60 nm about 300 nm.

Figure 3D:
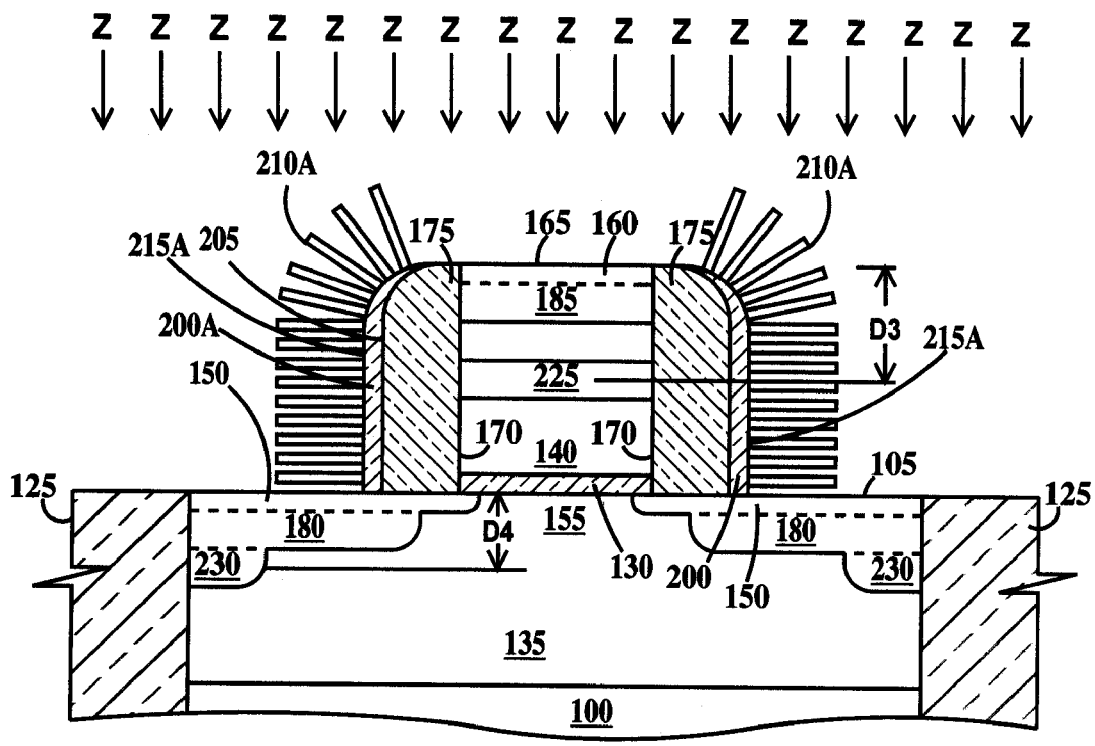

FIG. 3D is similar to FIG. 2D except spacers 200 and CNTs 210 of FIG. 2D are replaced by spacers 200A and CNTs 210A respectively in FIG. 3D.

Figure 3E:
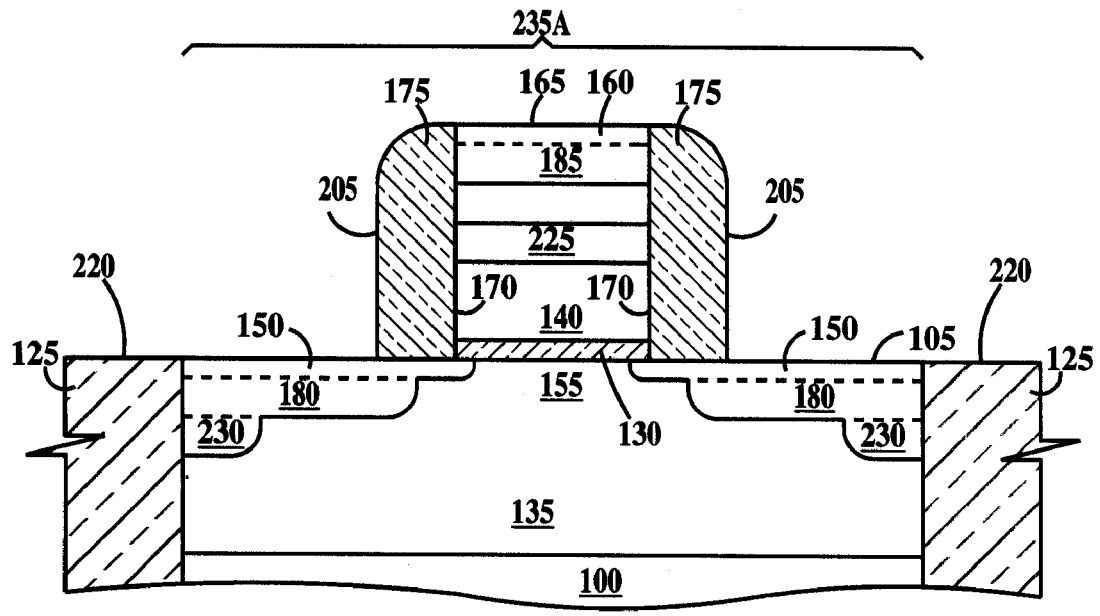

In FIG. 3E, CNTs 210A (see FIG. 3D) are removed using, for example, an oxygen or ozone plasma and spacers 200A are removed using for example an etchant containing hydrogen peroxide. Major fabrication steps of an FET 235A (which may be an NFET or a PFET) are thus completed. Additional steps, such as dopant activation anneal, silicidation of exposed top surfaces of source/drain regions 180 and exposed top surface of gate electrode 140, and forming contacts to gate electrode 140, source/drains 180, and substrate 100 may be performed.

Figure 3F:
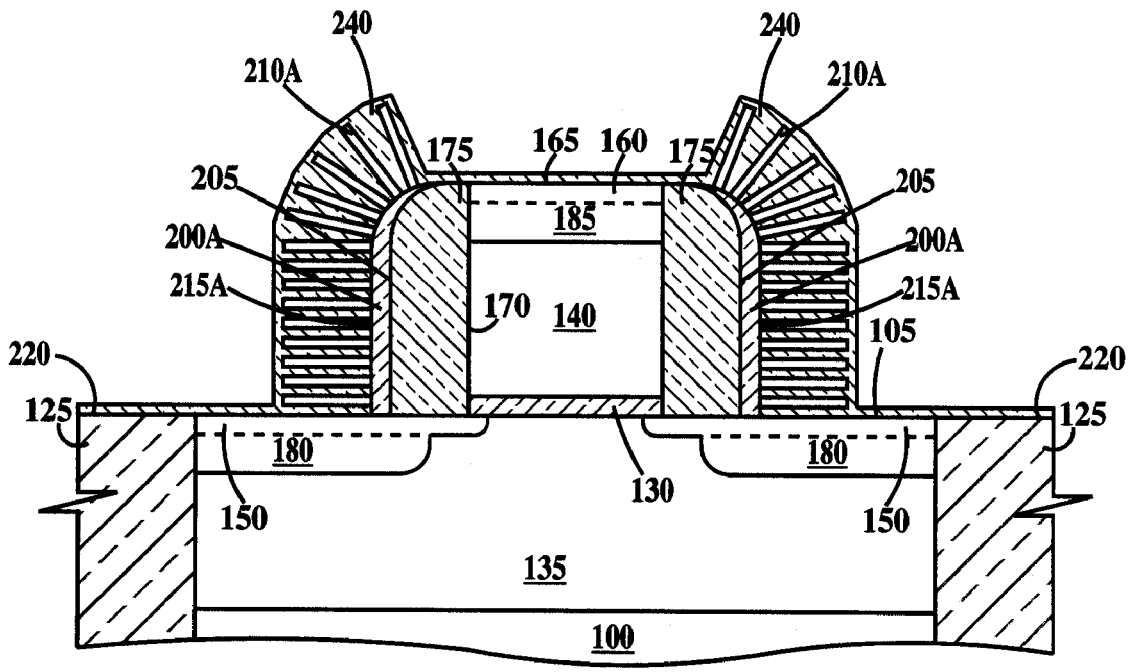
FIG. 3F is a cross-sectional drawing illustrating an optional step in the fabrication of a gate electrode of a field effect transistor according to a third embodiment of the present invention.

FIG. 3F is a cross-sectional drawing illustrating an optional step in the fabrication of a gate electrode of a field effect transistor according to a third embodiment of the present invention. In FIG. 3F, an optional conformal layer 240 is formed over CNTs 210A to stabilize and/or increase the blocking power to implantation of species Z (see FIG. 3D) prior to implantation of species Z described supra. In one example, conformal layer comprises a plasma carbon-fluorine polymer about 5 nm thick.

Thus, the present invention provides a method of fabricating an FET that results in reduced depletion layer in polysilicon gate electrode thickness when the device is turned on.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a structure, comprising:
providing a substrate having a top surface;
forming an island on said top surface of said substrate, a top surface of said island parallel to said top surface of said substrate, a sidewall of said island extending between said top surface of said island and said top surface of said substrate;
forming a spacer on said sidewall of said island, said spacer extending between said top surface of said island and said top surface of said substrate;
forming a plurality of carbon nanotubes on said spacer;
after forming said plurality of carbon nanotubes, forming a conformal layer on top of said carbon nanotubes; and
performing an ion implantation, said ion implantation penetrating into said island and blocked from penetrating into said substrate in regions of said substrate masked by said island, said spacer and said carbon nanotubes.

2. The method of claim 1, said ion implantation penetrating into said substrate in regions of said substrate where said substrate is not masked by said island, said spacer and said carbon nanotubes.

3. The method of claim 1, wherein said carbon nanotubes extend about perpendicular to said sidewall of said island.

4. The method of claim 1, wherein said island comprises polysilicon.

5. The method of claim 1, wherein said spacer comprises a material selected from the group consisting of a semiconductor oxide, a metal oxide, silicon dioxide, silicon oxynitride, aluminum oxide, tantalum oxide and hafnium oxide.

6. The method of claim 5, wherein said carbon nanotubes are formed by reaction of a carbon nanotube precursor and a carbon nanotube catalyst.

7. The method of claim 6, wherein said precursor is xylene or a xylene isomer mixture and said carbon nanotube catalyst is ferrocene.

8. The method of claim 1, wherein said spacer comprises a material selected from the group consisting of cobalt, nickel, and iron.

9. The method of claim 1, wherein said spacer catalyzes a reaction of a carbon nanotube precursor to form said carbon nanotubes.

10. The method of claim 9, wherein said precursor is selected from the group consisting of a mixture of carbon monoxide and hydrogen, a mixture of methane and ammonia, and a mixture of methane and acetylene.

11. The method of claim 1, wherein said substrate is a silicon-on-insulator substrate.

12. A method of fabricating a semiconductor transistor, comprising:
(a) providing a substrate;
(b) forming a gate dielectric layer on a top surface of said substrate;
(c) forming a polysilicon gate electrode on a top surface of said gate dielectric layer;
(d) forming spacers on opposite sidewalls of said polysilicon gate electrode;
(e) forming source/drain regions in said substrate on opposite sides of said polysilicon gate electrode and simultaneously forming a first doped region in said polysilicon gate electrode, said first doped region extending into said polysilicon gate electrode from a top surface of said polysilicon gate electrode;
(f) forming a plurality of carbon nanotubes on sidewalls of said spacers;
(g) forming, by ion implantation, a buried second doped region in said polysilicon gate electrode, said buried second doped region extending no deeper into said polysilicon gate electrode than to said gate dielectric layer and not penetrating into said gate dielectric layer or into said substrate in regions of said substrate masked by said polysilicon gate electrode, said spacers and said carbon nanotubes; and (h) removing said carbon nanotubes.

13. The method of claim 12, wherein (g) further comprises simultaneously forming buried third doped regions in said substrate under said source/drain regions where said ion implantation is not blocked from penetrating into said substrate in regions of said substrate not masked by said polysilicon gate electrode, said spacers and said carbon nanotube, said buried third doped regions not extending under said spacers.

14. The method of claim 12, wherein said carbon nanotubes extend about perpendicular to said sidewalls of said spacers.

15. The method of claim 12, wherein said spacer comprises silicon dioxide and said carbon nanotubes are formed by reaction of a carbon nanotube precursor and a carbon nanotube catalyst.

16. The method of claim 15, wherein said precursor is xylene or a xylene isomer mixture and said carbon nanotube catalyst is ferrocene.

17. The method of claim 12, further including between (c) and (d), forming source/drain extension regions in said substrate on opposite sides of said polysilicon gate electrode and simultaneously forming a fourth doped region in said polysilicon gate electrode, said fourth doped region extending into said polysilicon gate electrode from said top surface of said polysilicon gate electrode.

18. The method of claim 12, wherein said substrate is a bulk silicon substrate or a silicon-on-insulator substrate.

19. A method of fabricating a semiconductor transistor, comprising:

(a) providing a substrate;

(b) forming a gate dielectric layer on a top surface of said substrate;

(c) forming a polysilicon gate electrode on a top surface of said gate dielectric layer;

(d) forming first spacers on opposite sidewalls of said polysilicon gate electrode;

(e) forming source/drain regions in said substrate on opposite sides of said polysilicon gate electrode and simultaneously forming a first doped region in said polysilicon gate electrode, said first doped region extending into said polysilicon gate electrode from a top surface of said polysilicon gate electrode;

(f) forming second spacers on outer surfaces of said first spacers;

(g) forming a plurality of carbon nanotubes on sidewalls of said second spacers;

(h) forming, by ion implantation, a buried second doped region in said polysilicon gate electrode, said buried second doped region extending no deeper into said polysilicon gate electrode than to said gate dielectric layer and not penetrating into said gate dielectric layer or into said substrate in regions of said substrate masked by said polysilicon gate electrode, said spacers and said carbon nanotubes; and (i) removing said carbon nanotubes.

20. The method of claim 19, wherein (h) further comprises simultaneously forming buried third doped regions in said substrate under said source/drain regions where said ion implantation is not blocked from penetrating into said substrate in regions of said substrate not masked by said polysilicon gate electrode, said spacers and said carbon nanotube, said buried third doped regions not extending under said spacers.

21. The method of claim 19, wherein said carbon nanotubes extend about perpendicular to said sidewalls of said second spacers.

22. The method of claim 19, wherein said second spacer comprises a material selected from the group consisting of a semiconductor oxide, a metal oxide, silicon dioxide, silicon oxynitride, aluminum oxide, tantalum oxide and hafnium oxide.

23. The method of claim 22, wherein said carbon nanotubes are formed by reaction of a carbon nanotube precursor and a carbon nanotube catalyst.

24. The method of claim 23, wherein said precursor is xylene or a xylene isomer mixture and said carbon nanotube catalyst is ferrocene.

25. The method of claim 21, wherein said second spacers comprise a material selected from the consisting of cobalt, nickel, and iron.

26. The method of claim 23, wherein said layer catalyzes a reaction of a carbon nanotube precursor to form said carbon nanotubes.

27. The method of claim 24, wherein said precursor is selected from the group consisting of a mixture of carbon monoxide and hydrogen, a mixture of methane and ammonia, and a mixture of methane and acetylene.

28. The method of claim 19, wherein said substrate is a bulk silicon substrate or a silicon-on-insulator substrate.

29. The method of claim 19, further including after (i), removing said second spacers.

30. The method of claim 19, further including between (c) and (d), forming source/drain extension regions in said substrate on opposite sides of said polysilicon gate electrode and simultaneously forming a fourth doped region in said polysilicon gate electrode, said fourth doped region extending into said polysilicon gate electrode from a top surface of said polysilicon gate electrode.

* * * * *